(12) United States Patent
Yamazaki

(10) Patent No.: US 9,885,108 B2
(45) Date of Patent: Feb. 6, 2018

(54) METHOD FOR FORMING SPUTTERING TARGET

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 608 days.

(21) Appl. No.: 13/956,731

(22) Filed: Aug. 1, 2013

(65) Prior Publication Data

US 2014/0042674 A1    Feb. 13, 2014

(30) Foreign Application Priority Data

Aug. 7, 2012  (JP) .................................. 2012-174564

(51) Int. Cl.
*C23C 14/34*  (2006.01)
*C01G 15/00*  (2006.01)
(Continued)

(52) U.S. Cl.
CPC .......... *C23C 14/3414* (2013.01); *C01G 15/00* (2013.01); *C23C 14/086* (2013.01);
(Continued)

(58) Field of Classification Search
CPC .......... C04B 35/453; C04B 2235/3284; C04B 2235/3286
See application file for complete search history.

(56) References Cited

U.S. PATENT DOCUMENTS 5,528,032 A    6/1996  Uchiyama
5,700,419 A   12/1997  Matsunaga et al.
(Continued)

FOREIGN PATENT DOCUMENTS

CN    001545567 A    11/2004
CN    101268211 A     9/2008
(Continued)

OTHER PUBLICATIONS

Jones, J.T., and M.F. Berard. Ceramics: Industrial Processing and Testing. Ames, Iowa: Iowa State University Press, 1993. pp. 51-53 and 202-205.*

(Continued)

*Primary Examiner* — Erin Snelting
(74) *Attorney, Agent, or Firm* — Eric J. Robinson; Robinson Intellectual Property Law Office, P.C.

(57) ABSTRACT

To provide a sputtering target which enables an oxide film containing a plurality of metal elements and having high crystallinity. A plurality of raw materials are mixed and first baking is performed thereon, whereby a crystalline oxide is formed. The crystalline oxide is ground to form a crystalline oxide powder. The crystalline oxide powder is mixed with water and an organic substance to make slurry, and the slurry is poured into a mold provided with a filter. The water and the organic substance are removed from the slurry through the filter, so that a molded body is formed. The residual water and the residual organic substance in the molded body are removed, and then second baking is performed.

18 Claims, 8 Drawing Sheets

(51) Int. Cl.
*H01L 21/02* (2006.01)
*C23C 14/08* (2006.01)
(52) U.S. Cl.
CPC .. *H01L 21/02175* (2013.01); *H01L 21/02194* (2013.01); *H01L 21/02266* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,955,178 A | 9/1999 | Orita et al. |
| 5,972,527 A | 10/1999 | Kaijou et al. |
| 6,294,274 B1 | 9/2001 | Kawazoe et al. |
| 6,534,183 B1 | 3/2003 | Inoue |
| 6,563,174 B2 | 5/2003 | Kawasaki et al. |
| 6,669,830 B1 | 12/2003 | Inoue et al. |
| 6,689,477 B2 | 2/2004 | Inoue |
| 6,727,522 B1 | 4/2004 | Kawasaki et al. |
| 6,907,849 B2 | 6/2005 | Galvin |
| 6,998,070 B2 | 2/2006 | Inoue et al. |
| 7,008,519 B2 * | 3/2006 | Takahashi et al. ...... 204/192.23 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,306,861 B2 | 12/2007 | Inoue et al. |
| 7,323,356 B2 | 1/2008 | Hosono et al. |
| 7,385,224 B2 | 6/2008 | Ishii et al. |
| 7,393,600 B2 | 7/2008 | Inoue et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,510,635 B2 | 3/2009 | Shindo et al. |
| 7,648,657 B2 | 1/2010 | Inoue et al. |
| 7,674,650 B2 | 3/2010 | Akimoto et al. |
| 7,732,819 B2 | 6/2010 | Akimoto et al. |
| 7,790,644 B2 * | 9/2010 | Takahashi et al. ........... 501/134 |
| 7,791,072 B2 | 9/2010 | Kumomi et al. |
| 7,959,982 B2 | 6/2011 | Craz |
| 8,004,173 B2 * | 8/2011 | Sato et al. ..................... 313/495 |
| 8,137,594 B2 | 3/2012 | Imanishi et al. |
| 8,153,031 B2 | 4/2012 | Yano et al. |
| 8,202,365 B2 | 6/2012 | Umeda et al. |
| 8,237,166 B2 | 8/2012 | Kumomi et al. |
| 8,274,078 B2 | 9/2012 | Itagaki et al. |
| 8,304,359 B2 | 11/2012 | Yano et al. |
| 8,333,913 B2 | 12/2012 | Inoue et al. |
| 8,383,019 B2 | 2/2013 | Yano et al. |
| 8,492,862 B2 | 7/2013 | Yamazaki et al. |
| 8,593,858 B2 | 11/2013 | Kamata |
| 8,668,849 B2 | 3/2014 | Inoue et al. |
| 8,795,554 B2 | 8/2014 | Yano et al. |
| 9,202,603 B2 | 12/2015 | Yano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0180217 A1 | 9/2004 | Inoue et al. |
| 2004/0222089 A1 | 11/2004 | Inoue et al. |
| 2004/0231981 A1 * | 11/2004 | Takahashi et al. ...... 204/298.13 |
| 2005/0017302 A1 | 1/2005 | Hoffman |
| 2005/0170311 A1 | 8/2005 | Tardieu et al. |
| 2005/0189401 A1 | 9/2005 | Butzer et al. |
| 2005/0199959 A1 | 9/2005 | Chiang et al. |
| 2005/0227062 A1 * | 10/2005 | Sato et al. ..................... 428/323 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0098626 A1 | 5/2007 | Shindo et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197750 A1 | 8/2008 | Katardjiev et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308774 A1 | 12/2008 | Inoue et al. |
| 2009/0068773 A1 | 3/2009 | Lai et al. |
| 2009/0073325 A1 | 3/2009 | Kuwabara et al. |
| 2009/0085014 A1 * | 4/2009 | Ikisawa et al. ................ 252/512 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0197757 A1 * | 8/2009 | Fukushima ................... 501/127 |
| 2009/0278122 A1 | 11/2009 | Hosono et al. |
| 2009/0280600 A1 | 11/2009 | Hosono et al. |
| 2010/0009314 A1 | 1/2010 | Tardieu et al. |
| 2010/0065424 A1 * | 3/2010 | Takahashi et al. ...... 204/298.13 |
| 2010/0065844 A1 | 3/2010 | Tokunaga |
| 2010/0092800 A1 | 4/2010 | Itagaki et al. |
| 2010/0108502 A1 | 5/2010 | Inoue et al. |
| 2010/0109002 A1 | 5/2010 | Itagaki et al. |
| 2010/0173106 A1 | 7/2010 | LeCraz |
| 2010/0320458 A1 | 12/2010 | Umeda et al. |
| 2010/0320459 A1 | 12/2010 | Umeda et al. |
| 2011/0114480 A1 | 5/2011 | Yamazaki et al. |
| 2011/0114944 A1 | 5/2011 | Yamazaki et al. |
| 2011/0114999 A1 | 5/2011 | Yamazaki et al. |

(56) References Cited

U.S. PATENT DOCUMENTS

| | | | |
|---|---|---|---|
| 2011/0121244 A1* | 5/2011 | Yano | C04B 35/453 252/519.51 |
| 2011/0127521 A1 | 6/2011 | Yamazaki | |
| 2011/0151618 A1 | 6/2011 | Yamazaki et al. | |
| 2011/0168994 A1 | 7/2011 | Kawashima et al. | |
| 2011/0180392 A1 | 7/2011 | Yano et al. | |
| 2011/0198594 A1 | 8/2011 | Yamazaki | |
| 2011/0240988 A1* | 10/2011 | Yano et al. | 257/43 |
| 2011/0244652 A1 | 10/2011 | Yamazaki et al. | |
| 2011/0260118 A1 | 10/2011 | Yano et al. | |
| 2011/0275032 A1 | 11/2011 | Tardieu et al. | |
| 2011/0284848 A1 | 11/2011 | Yamazaki | |
| 2012/0012847 A1 | 1/2012 | Koyama et al. | |
| 2012/0032162 A1 | 2/2012 | Matsubayashi | |
| 2012/0049183 A1 | 3/2012 | Yamazaki | |
| 2012/0051120 A1 | 3/2012 | Kamata | |
| 2012/0052606 A1 | 3/2012 | Yamazaki | |
| 2012/0052624 A1 | 3/2012 | Yamazaki | |
| 2012/0061663 A1 | 3/2012 | Yamazaki et al. | |
| 2012/1006813 | 3/2012 | Inoue et al. | |
| 2012/0279856 A1* | 11/2012 | Medvedovski et al. | 204/298.13 |
| 2012/0312681 A1* | 12/2012 | Yamazaki | C23C 14/08 204/192.1 |
| 2012/0319100 A1 | 12/2012 | Yoshioka et al. | |
| 2012/0325650 A1 | 12/2012 | Yamazaki et al. | |
| 2013/0011962 A1 | 1/2013 | Yamazaki et al. | |
| 2013/0133808 A1* | 5/2013 | Yamazaki et al. | 156/89.11 |
| 2013/0161608 A1* | 6/2013 | Yamazaki | 257/43 |
| 2013/0202850 A1* | 8/2013 | Nakayama | C04B 35/01 428/141 |
| 2013/0314842 A1* | 11/2013 | Kang et al. | 361/303 |
| 2013/0341180 A1 | 12/2013 | Yamazaki | |
| 2014/0001032 A1 | 1/2014 | Yamazaki | |
| 2014/0021036 A1* | 1/2014 | Yamazaki | 204/192.1 |
| 2014/0042014 A1 | 2/2014 | Yamazaki | |
| 2014/0042018 A1 | 2/2014 | Yamazaki | |
| 2014/0042437 A1* | 2/2014 | Yamazaki | 257/43 |
| 2014/0145124 A1* | 5/2014 | Sunagawa et al. | 252/519.51 |
| 2015/0129416 A1 | 5/2015 | Yamazaki | |
| 2015/0184280 A1* | 7/2015 | Medvedovski | C04B 35/457 252/520.1 |

FOREIGN PATENT DOCUMENTS

| | | |
|---|---|---|
| EP | 1422312 A | 5/2004 |
| EP | 1431414 A | 6/2004 |
| EP | 1737044 A | 12/2006 |
| EP | 2226847 A | 9/2010 |
| EP | 2264211 A | 12/2010 |
| EP | 2278041 A | 1/2011 |
| EP | 2280092 A | 2/2011 |
| JP | 60-198861 A | 10/1985 |
| JP | 62-122011 A | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-104937 A | 4/1992 |
| JP | 05-251705 A | 9/1993 |
| JP | 06-275697 A | 9/1994 |
| JP | 06-340468 A | 12/1994 |
| JP | 07-333438 A | 12/1995 |
| JP | 08-264794 A | 10/1996 |
| JP | 11-505377 | 5/1999 |
| JP | 11-286002 A | 10/1999 |
| JP | 2000-044236 A | 2/2000 |
| JP | 2000-150900 A | 5/2000 |
| JP | 2002-076356 A | 3/2002 |
| JP | 2002-265221 A | 9/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-285760 A | 11/2008 |
| JP | 2009-275272 A | 11/2009 |
| JP | 2010-018457 A | 1/2010 |
| JP | 2010-070418 A | 4/2010 |
| JP | 2010-177431 A | 8/2010 |
| JP | 2011-058012 A | 3/2011 |
| JP | 2011-084765 A | 4/2011 |
| JP | 2011-098855 | 5/2011 |
| JP | 2011-256088 | 12/2011 |
| JP | 2012-026039 A | 2/2012 |
| JP | 2012-074125 A | 4/2012 |
| KR | 2004-0030889 A | 4/2004 |
| KR | 2008-0046197 A | 5/2008 |
| TW | I238199 | 8/2005 |
| WO | WO-02/072912 | 9/2002 |
| WO | WO-2003/014409 | 2/2003 |
| WO | WO-2004/114391 | 12/2004 |
| WO | WO-2007/034733 | 3/2007 |

OTHER PUBLICATIONS

Yamazaki.S et al., "Research, Development, and Application of Crystalline Oxide Semiconductor," SID Digest '12: SID International Symposium Digest of Technical Papers, Jun. 5, 2012, pp. 183-186.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5) $InGaO_3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

(56) References Cited

OTHER PUBLICATIONS

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symosium Digest of Technical Papers, May 31, 2009, pp. 983-985.

Sakata.J at al., "Development of 4.0-IN. AMOLED Display With Driver Circuit Using Amorphous In—Ga—Zn—Oxide TFTs,", IDW '09 : Proceedings of the 16th International Display Workshops, 2009, pp. 689-692.

Park.J at al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T at al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No, 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 194, vol. 29, No. 5, pp. 2957-2959.

(56) References Cited

OTHER PUBLICATIONS

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kobayashi.M et al., "InGaZnO TFT Deposition Technology for Large Substrates", ULVAC Technical Journal, 2010, No. 73E, pp. 10-17.

\* cited by examiner

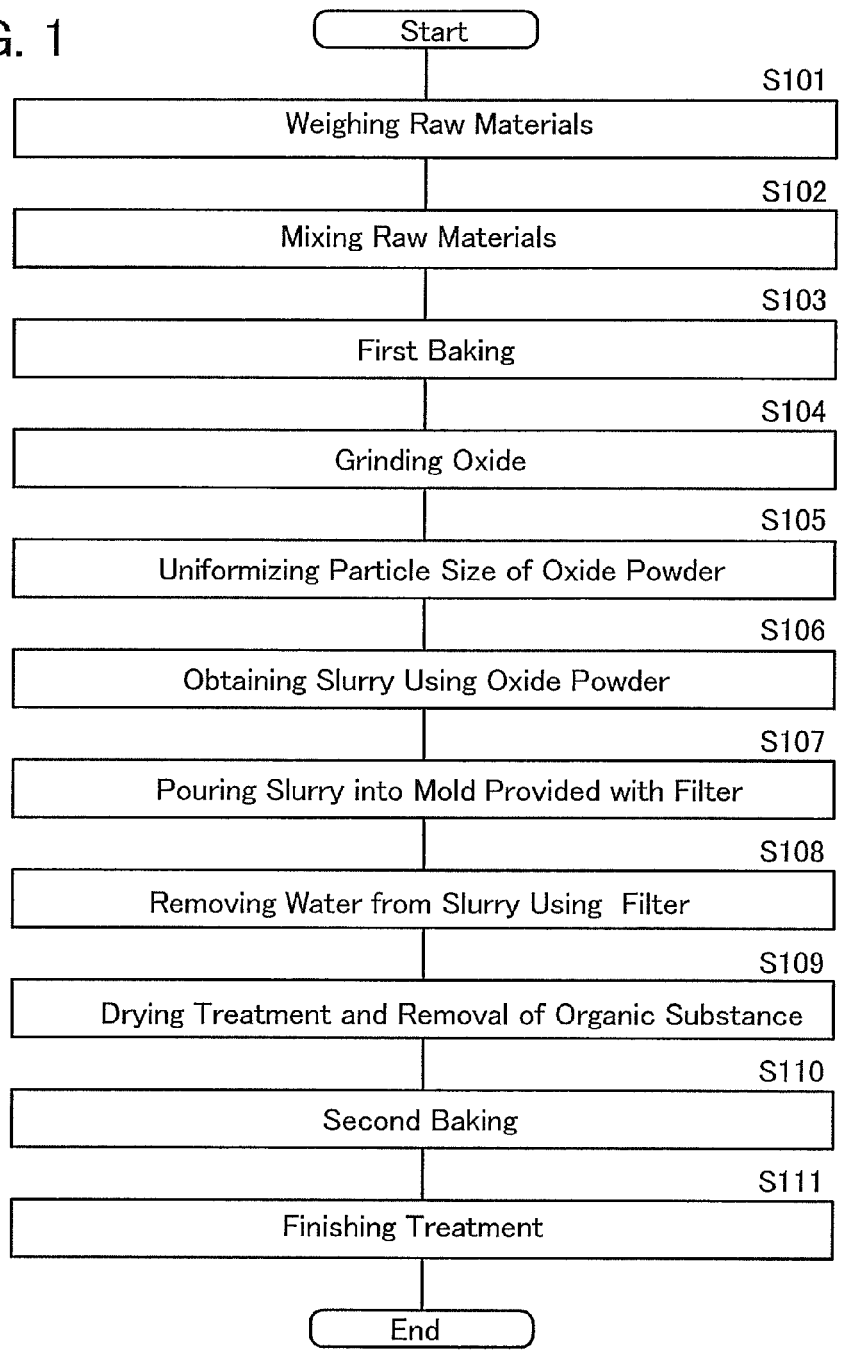

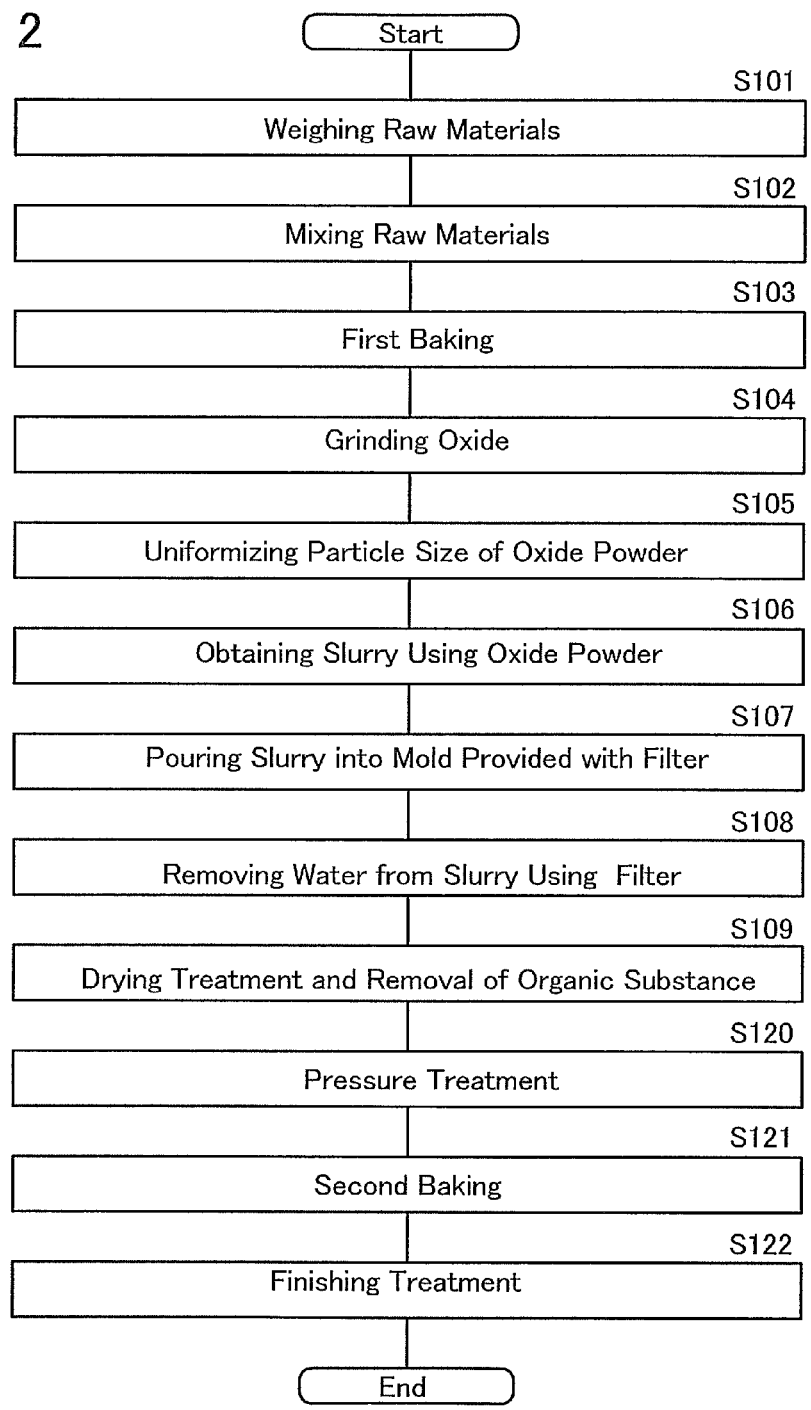

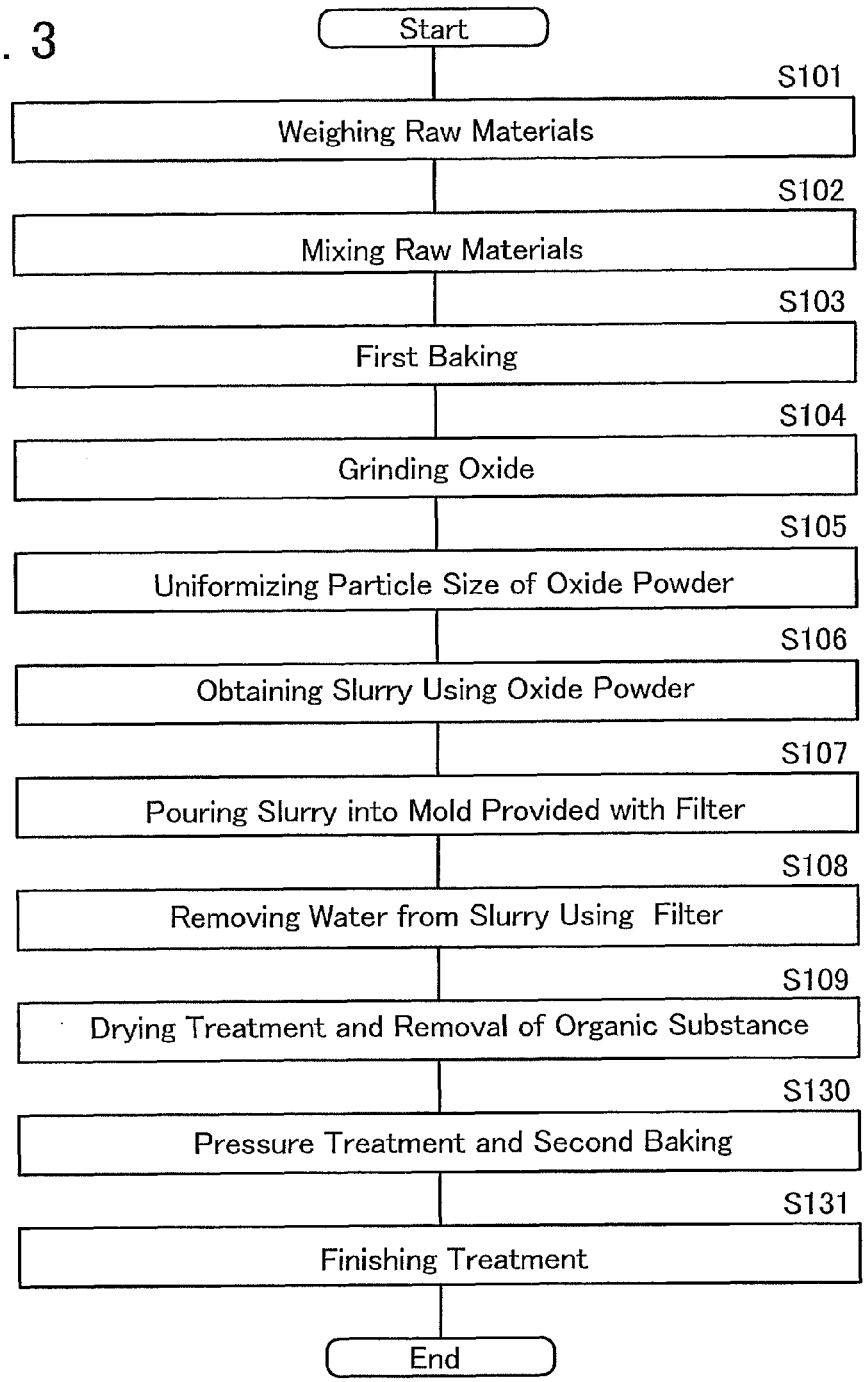

METHOD FOR FORMING SPUTTERING TARGET

BACKGROUND OF THE INVENTION

1. Field of the Invention

The present invention relates to a sputtering target and a manufacturing method thereof. In addition, the present invention relates to an oxide film formed by a sputtering method with use of the sputtering target, and a semiconductor device including the oxide film.

In this specification, a semiconductor device generally refers to a device which can function by utilizing semiconductor characteristics; an electro-optical device, a semiconductor circuit, and an electronic device are all included in the category of the semiconductor device.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon film is widely known as a semiconductor thin film applicable to the transistor. As another material, an oxide semiconductor film has been attracting attention.

For example, a transistor including an amorphous oxide semiconductor film that contains indium (In), gallium (Ga), and zinc (Zn) and has an electron carrier concentration less than $10^{18}/cm^3$ is disclosed. As a method for forming the amorphous oxide semiconductor film, a sputtering method is considered the most suitable (see Patent Document 1).

Although a transistor including an oxide semiconductor film containing a plurality of metal elements can obtain transistor characteristics relatively with ease, the oxide semiconductor film is likely to be amorphous and has unstable physical properties. Thus, it is has been difficult to secure reliability of such a transistor.

On the other hand, there is a report that a transistor including a crystalline oxide semiconductor film has more excellent electric characteristics and higher reliability than a transistor including an amorphous oxide semiconductor film (see Non-Patent Document 1).

REFERENCE

Patent Document

[Patent Document 1] Japanese Published Patent Application No. 2006-165528

Non-Patent Document

[Non-Patent Document 1] Shunpei Yamazaki, Jun Koyama, Yoshitaka Yamamoto, and Kenji Okamoto, "Research, Development, and Application of Crystalline Oxide Semiconductor", *SID* 2012 *DIGEST*, pp. 183-186

SUMMARY OF THE INVENTION

An object is to provide a sputtering target which enables formation of an oxide film containing a plurality of metal elements and having high crystallinity.

Another object is to provide a method for forming an oxide film having high crystallinity with use of the sputtering target.

One embodiment of the present invention is a method for forming a sputtering target which includes the following steps: a step of mixing a plurality of raw materials; a step of performing a first baking of the mixed raw materials to form a crystalline oxide; a step of grinding the crystalline oxide to form a crystalline oxide powder; a step of mixing the crystalline oxide powder with water and an organic substance to make slurry; a step of pouring the slurry into a mold provided with a filter; a step of removing the water and the organic substance from the slurry through the filter to form a molded body; and a step of performing a second baking after removing the water and the organic substance remained in the molded body.

Another embodiment of the present invention is a method for forming a sputtering target which includes the following steps: a step of mixing a plurality of raw materials; a step of performing a first baking of the mixed raw materials to form a crystalline oxide; a step of grinding the crystalline oxide to form a crystalline oxide powder; a step of mixing the crystalline oxide powder with water and an organic substance to make slurry; a step of pouring the slurry into a mold provided with a filter; a step of removing the water and the organic substance from the slurry through the filter, thereby forming a molded body; a step of removing the residual water and the residual organic substance in the molded body, thereby providing voids in the molded body; a step of performing a pressure treatment on the molded body to reduce the voids; and a step of performing a second baking of the molded body in which the voids are reduced.

Another embodiment of the present invention is a method for forming a sputtering target which includes the following steps: a step of mixing a plurality of raw materials; a step of performing a first baking of the mixed raw materials to form a crystalline oxide; a step of grinding the crystalline oxide to form a crystalline oxide powder; a step of mixing the crystalline oxide powder with water and an organic substance to make slurry; a step of pouring the slurry into a mold provided with a filter; a step of removing water and an organic substance from the slurry through the filter to form a molded body; a step of removing the residual water and the residual organic substance in the molded body; and a step of performing a pressure treatment on the molded body while performing a second baking on the molded body.

The first baking is performed in an inert atmosphere or an oxidation atmosphere at a temperature higher than or equal to 1200° C. and lower than or equal to 1700° C. for a period longer than or equal to 1 hour and shorter than or equal to 72 hours, preferably longer than or equal to 9 hours and shorter than or equal to 72 hours, further preferably longer than or equal to 17 hours and shorter than or equal to 72 hours. The first baking may be performed under a reduced pressure which is lower than or equal to 100 Pa, lower than or equal to 10 Pa, or lower than or equal to 1 Pa.

The second baking is performed in an inert atmosphere or an oxidation atmosphere at a temperature higher than or equal to 400° C. and lower than or equal to 1400° C. for a period longer than or equal to 1 hour and shorter than or equal to 72 hours, preferably longer than or equal to 9 hours and shorter than or equal to 72 hours, further preferably longer than or equal to 17 hours and shorter than or equal to 72 hours. The second baking may be performed under a reduced pressure which is lower than or equal to 100 Pa, lower than or equal to 10 Pa, or lower than or equal to 1 Pa.

Further, it is preferable that after a treatment in which the particle size of the crystalline oxide powder is made to be greater than or equal to 0.01 μm and less than or equal to 1 μm, preferably greater than or equal to 0.01 μm and less than or equal to 0.5 μm, further preferably greater than or equal to 0.01 μm and less than or equal to 0.3 μm is performed, the crystalline oxide powder be mixed with water and an organic substance to make slurry. Here, the particle size of the crystalline oxide powder indicates the maximum diameter of a particle the crystalline oxide powder. Note that, in the present invention, the grain size of a crystal grain indicates a diameter of a perfect circle having the same area as a given cross section of the crystal grain.

Another embodiment of the present invention is a method for forming a sputtering target using an indium oxide, a gallium oxide, and a zinc oxide as a plurality of raw materials.

In accordance with one embodiment of the present invention, a first baking is performed after the plurality of raw materials are mixed, whereby an oxide that is a reaction product is obtained. Thus, when an oxide powder which is obtained by grinding the oxide is used to form a sputtering target, the amount of raw materials remaining unreacted can be reduced.

Further, the first baking enables crystallization of the oxide as well as formation of the oxide; thus, a crystalline oxide can be formed. A crystalline oxide powder which is obtained by grinding the crystalline oxide has high crystallinity. Note that a crystal grain included in the crystalline oxide has a cleavage plane. The cleavage plane indicates a portion where a bond of atoms or molecules constituting the crystal is weak (i.e., a plane where cleavage occurs or a plane which is easily cleaved).

The crystalline oxide is cleaved along the cleavage plane; accordingly, a particle of the crystalline oxide powder can be smaller than the crystal grain included in the crystalline oxide. The particle of the crystalline oxide powder has a flat-plate-like shape which has a flat plane corresponding to the cleavage plane of the crystal grain. Consequently, when a molded body is formed by making the flat-plate-like crystalline oxide powder spread over, a crystalline portion included in the molded body has extremely high orientation.

Further, the crystalline oxide powder is made to pass through a sieve, so that the crystalline oxide powder with a particle size less than or equal to 1 μm, less than or equal to 0.5 μm, or less than or equal to 0.3 μm is obtained. Furthermore, the crystalline oxide powder may be made to pass through different sieves, so that the oxide powder which is less than 0.01 μm and has low crystallinity is removed.

In accordance with one embodiment of the present invention, the crystalline oxide powder is mixed with water and an organic substance to make slurry, the slurry is poured into a mold provided with a filter, and the water and the organic substance are removed from slurry through the filter, so that a molded body is formed. Consequently, the crystalline oxide powder can spread without a gap.

The sputtering target formed in the above manner includes a polycrystalline oxide with high orientation. In the polycrystalline oxide, crystal grains have a uniform and small grain size. Thus, the crystallinity of an oxide film formed using the sputtering target can be increased.

The first baking enables crystallization of an oxide as well as formation of the oxide; thus, a crystalline oxide can be formed. With use of a crystalline oxide powder obtained by grinding the crystalline oxide, a sputtering target including a polycrystalline oxide with high orientation can be formed.

With use of the sputtering target, an oxide film with high crystallinity can be formed.

BRIEF DESCRIPTION OF THE DRAWINGS

FIG. 1 is a flow chart showing an example of a method for forming a sputtering target.

FIG. 2 is a flow chart showing an example of a method for forming a sputtering target.

FIG. 3 is a flow chart showing an example of a method for forming a sputtering target.

DETAILED DESCRIPTION OF THE INVENTION

Figures 4A, 4B:
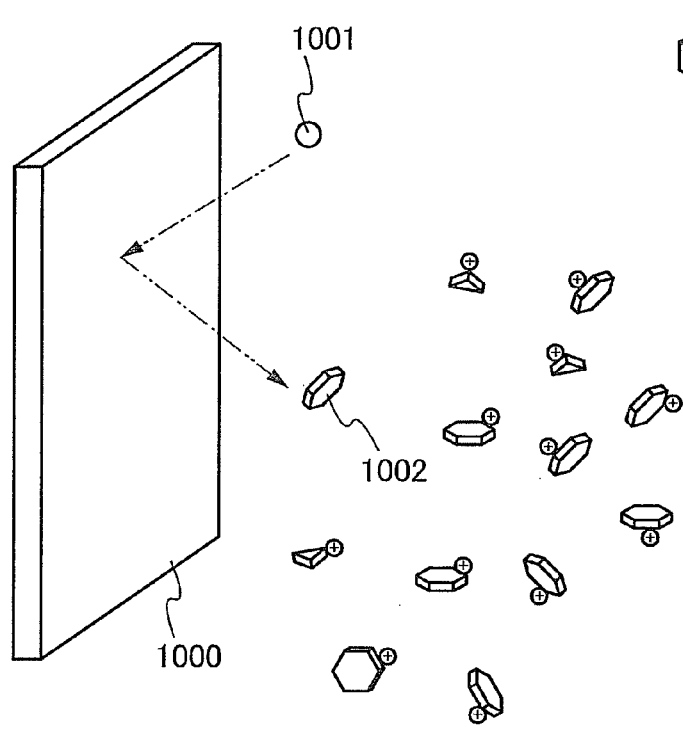
FIGS. 4A and 4B are schematic diagrams illustrating a situation where a sputtered particle is separated from a sputtering target.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Note that an oxidation atmosphere refers to an atmosphere containing an oxidation gas. The oxidation gas is oxygen, ozone, nitrous oxide, or the like, and it is preferable that the oxidation gas do not contain water, hydrogen, and the like. For example, the purity of oxygen, ozone, or nitrous oxide introduced to a heat treatment apparatus is greater than or equal to 8N (99.999999%), preferably greater than or equal to 9N (99.9999999%). The oxidation atmosphere may contain a mixed gas of an oxidation gas and an inert gas. In that case, the atmosphere contains an oxidation gas at a concentration at least higher than or equal to 10 ppm. Further, an inert atmosphere refers to an atmosphere containing an inert gas such as nitrogen or a rare gas or an atmosphere which does not contain a reaction gas such as an oxidation gas. Specifically, in an inert atmosphere, the concentration of a reactive gas such as an oxidizing gas is lower than 10 ppm. Note that the pressure of each of the oxidation atmosphere and the inert atmosphere may under reduced pressure that is lower than or equal to 100 Pa, lower than or equal to 10 Pa, or lower than or equal to 1 Pa.

(Embodiment 1)

In this embodiment, a sputtering target of one embodiment of the present invention will be described.

FIG. 1 shows a method for forming a sputtering target.

First, raw materials are weighed in a step S101. As the raw materials, first to n-th (n is a natural number greater than or equal to 2) oxide powders are used. For example, an indium oxide powder, a gallium oxide powder, and a zinc oxide powder are used. Note that instead of the gallium oxide powder, a tin oxide powder, an aluminum oxide powder, a titanium oxide powder, a nickel oxide powder, a zirconium oxide powder, a lanthanum oxide powder, a cerium oxide powder, a neodymium oxide powder, a hafnium oxide powder, a tantalum oxide powder, or a tungsten oxide powder may be used. In this embodiment, the molar ratio of the indium oxide powder to the gallium oxide powder and the zinc oxide powder is 2:2:1, 8:4:3, 3:1:1, 1:1:1, 4:2:3, 1:1:2, 3:1:4, or 3:1:2. With such a molar ratio, a sputtering target including a polycrystalline oxide with high crystallinity can be obtained easily later.

However, a raw material used in this embodiment is not limited to the above raw materials. For example, the following raw materials may be used: an indium oxide powder and a zinc oxide powder; an indium oxide powder and a gallium oxide powder; a gallium oxide powder and a zinc oxide powder; an aluminum oxide powder and a zinc oxide powder; a zinc oxide powder and a tin oxide powder; or an indium oxide powder and a tin oxide powder.

Next, the weighed raw materials are mixed in a step S102.

Next, first baking is performed on the mixed raw material to obtain an oxide that is a reaction product. The first baking is performed in an inert atmosphere or an oxidation atmosphere at a temperature higher than or equal to 700° C. and lower than or equal to 1700° C., preferably higher than or equal to 1200° C. and lower than or equal to 1700° C. The treatment time of the first baking may be, for example, longer than or equal to 1 hour and shorter than or equal to 72 hours, preferably longer than or equal to 9 hours and shorter than or equal to 72 hours, further preferably longer than or equal to 17 hours and shorter than or equal to 72 hours. In this embodiment, by the first baking, the indium oxide powder, the gallium oxide powder, and the zinc oxide powder are reacted to obtain an In—Ga—Zn oxide. Note that when the temperature of the first baking is higher than or equal to 700° C. and lower than or equal to 1700° C., preferably higher than or equal to 1200° C. and lower than or equal to 1700° C., crystallinity of the In—Ga—Zn oxide can be increased. Further, the longer the first baking time is, the lower the concentration of impurities contained in the In—Ga—Zn oxide can be. Note that when the baking time exceeds 72 hours, a change in crystallinity or a change in the impurity concentration is very small. Thus, for an improvement in productivity, it is preferable that the treatment time of the first baking be set to be shorter than or equal to 72 hours. However, it is acceptable to perform the first baking for 72 hours or longer.

Note that a time needed for temperature rising in the first baking is longer than or equal to 0 hours and shorter than or equal to 12 hours, preferably longer than or equal to 0 hours and shorter than or equal to 5 hours, further preferably longer than or equal to 0 hours and shorter than or equal to 2 hours. Further, a time needed for temperature decreasing in the first baking is longer than or equal to 0 hours and shorter than or equal to 12 hours, preferably longer than or equal to 0 hours and shorter than or equal to 5 hours, further preferably longer than or equal to 0 hours and shorter than or equal to 2 hours. When the time needed for temperature rising and the time needed for temperature decreasing in the first baking are made short, crystal grains contained in the In—Ga—Zn oxide can be small and are easily pulverized in a later step.

In this specification, the time needed for temperature rising indicates a time from when the temperature rising starts to when the temperature reaches 90% of the maximum temperature of baking. The treatment time of baking indicates a time from when the temperature becomes higher than or equal to 90% of the maximum temperature of baking to when the temperature decreases to be lower than 90% thereof. Further, the time needed for temperature decreasing indicates a time from when the temperature becomes lower than 90% of the maximum temperature of baking to when an object is taken out. For example, the time needed for temperature decreasing indicates a time when the temperature becomes lower than or equal to 150° C., lower than or equal to 100° C., or lower than or equal to 50° C.

The first baking may be performed plural times with different conditions. Specifically, it is preferable that after baking in an inert atmosphere is performed, baking be performed in an oxidation atmosphere. This is because in the case where the amount of impurities contained in an In—Ga—Zn oxide is reduced in an inert atmosphere, oxygen vacancies are caused in the In—Ga—Zn oxide. Thus, it is preferable that the oxygen vacancies caused in the In—Ga—Zn oxide be reduced in an oxidation atmosphere. By reducing the impurity concentration and oxygen vacancies, an In—Ga—Zn oxide with high crystallinity can be obtained.

As described above, the concentration of impurities contained in the In—Ga—Zn oxide can be reduced. Specifically, each of alkali metals can be lower than 10 ppm by weight, preferably lower than 5 ppm by weight, further preferably lower than 2 ppm by weight. Each of alkaline earth metals can be lower than 5 ppm by weight, preferably lower than 2 ppm by weight, further preferably lower than 1 ppm by weight. Halogen can be lower than 10 ppm by weight, preferably lower than 5 ppm by weight, further preferably lower than 2 ppm by weight. Boron, magnesium, phosphorus, copper, and germanium can be each lower than 5 ppm by weight, preferably lower than 2 ppm by weight, further preferably lower than 1 ppm by weight. Nitrogen can be lower than 20 ppm by weight, preferably lower than 10 ppm by weight, further preferably lower than 5 ppm by weight, still further preferably lower than 2 ppm by weight. Silicon can be lower than 50 ppm by weight, preferably lower than 20 ppm by weight, further preferably lower than 10 ppm by weight, still further preferably lower than 5 ppm by weight. Note that the concentration of impurities contained in the In—Ga—Zn oxide may be measured by secondary ion mass spectrometry (SIMS), glow discharge mass spectrometry (GDMS), inductively coupled plasma mass spectrometry (ICP-MS), or the like.

Next, an In—Ga—Zn oxide powder with crystallinity is obtained by grinding the In—Ga—Zn oxide in a step S104. A mill machine such as a ball mill may be used for grinding the In—Ga—Zn oxide. For a ball of the ball mill, a substance with a high degree of hardness such as agate, aluminum oxide, zirconium oxide, tungsten carbide, or silicon carbide may be used. There is no particular limitation on a container used for the ball mill. A substance that is the same as the ball is preferably used. Note that the treatment time for grinding in the ball mill is preferably longer than or equal to 8 hours and shorter than or equal to 72 hours, preferably longer than or equal to 20 hours and shorter than or equal to 72 hours.

Note that after the step S104 is performed, the process returns to the step S103, and the In—Ga—Zn oxide powder may be subjected to the first baking. In that case, after the first baking, the In—Ga—Zn oxide is ground again in the step S104. When the step S103 and the step S104 are performed plural times, crystallinity of the In—Ga—Zn oxide powder can be further increased.

Figure 6A:
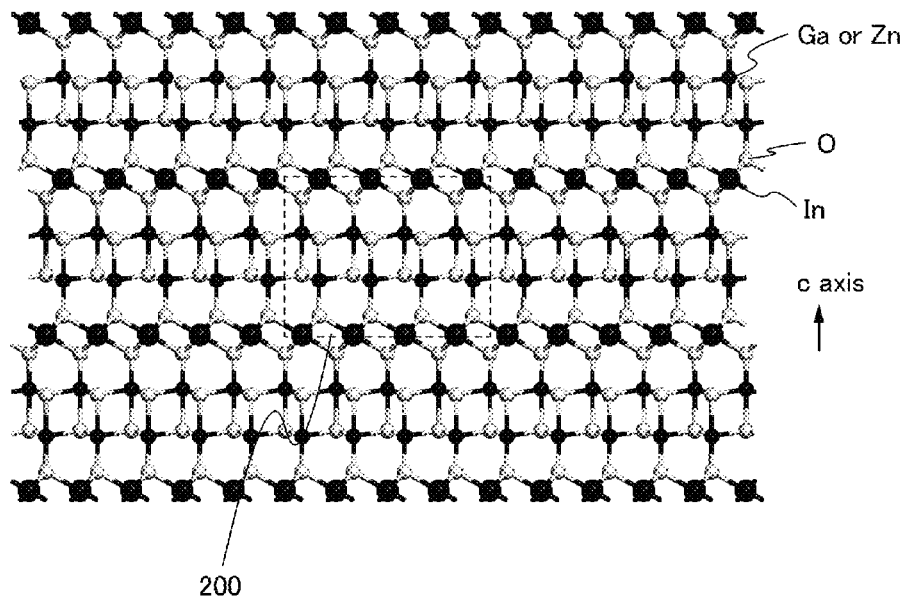
FIGS. 6A and 6B are diagrams illustrating an example of a crystal structure of an In—Ga—Zn oxide.

FIG. 6A illustrates an example of a crystal structure of an In—Ga—Zn oxide viewed from a direction parallel to an a-b plane of the crystal. Further, FIG. 6B illustrates an enlarged portion surrounded by a dashed line 200 in FIG. 6A.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Figure 6B:
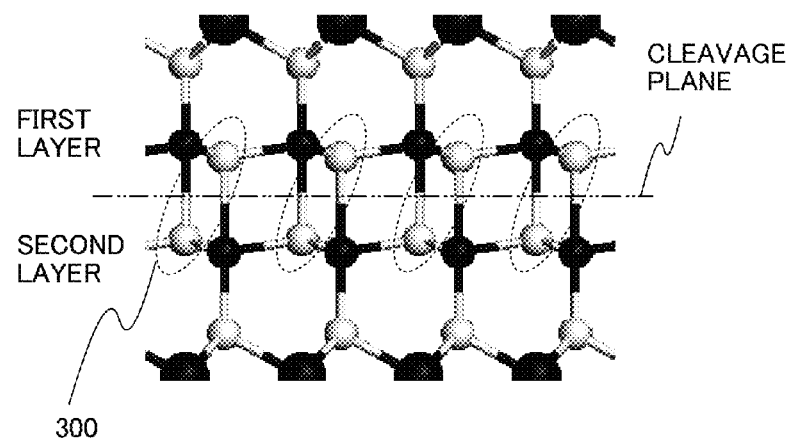

For example, in a crystal grain of an In—Ga—Zn oxide, a cleavage plane is a plane between a first layer and a second layer as illustrated in FIG. 6B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions 300 in FIG. 6B). Since the cleavage plane is a plane parallel to an a-b plane, the particle of the In—Ga—Zn oxide powder that is to be obtained has a flat-plate-like shape having a plane parallel to an a-b plane. Further, the crystal of the In—Ga—Zn oxide shown in FIGS. 6A and 6B is a hexagonal crystal; thus the flat-plate-like particle is likely to have a hexagonal prism shape with a regular hexagonal plane whose internal angle is 120°.

Next, the particle size of the obtained In—Ga—Zn oxide powder is made uniform in a step S105. In this step, treatment is performed so that a particle size of the In—Ga—Zn oxide powder is less than or equal to 1 μm, preferably less than or equal to 0.5 lam, further preferably less than or equal to 0.3 μm. For this treatment, a sieve or a filter through which a particle with a size less than or equal to 1 μm, preferably less than or equal to 0.5 μm, further preferably less than or equal to 0.3 μm passes may be used. Then, an In—Ga—Zn oxide powder having a grain size less than 0.01 μm and low crystallinity is preferably removed. For removing such an oxide powder, a sieve or a filter through which a particle with a size less than 0.01 μm passes may be used. In the above manner, an In—Ga—Zn oxide powder whose particle size is greater than or equal to 0.01 μm and less than or equal to 1 μm, greater than or equal to 0.01 μm and less than or equal to 0.5 μm, or greater than or equal to 0.01 μm and less than or equal to 0.3 μm can be obtained.

Next, the In—Ga—Zn oxide powder is mixed with water and an organic substance (dispersing agent and binder) to obtain slurry in a step S106.

Next, the slurry is poured into a mold in a step S107. At least one suction port is provided at a bottom of the mold, which enables suction of water and the like. In addition, a filter is provided at the bottom of the mold. The filter has a function of inhibiting the In—Ga—Zn oxide powder to pass and allowing water and the organic substance to pass. Specifically, a filter in which a porous resin film is attached over a woven fabric or a felt may be used.

Next, in a step S108, water and the like is sucked from the slurry with the filter provided at the bottom of the mold, so that water and the organic substance are removed from the slurry and a molded body is formed.

Note that in the obtained molded body, water and the organic substance are slightly left; thus, drying treatment and a removal of the organic substance are performed in a step S109. The drying treatment is preferably natural drying because the molded body is less likely to be cracked. Further, the molded body is subjected to heat treatment at a temperature higher than or equal to 300° C. and lower than or equal to 700° C., so that residual water and organic substance which cannot be eliminated by natural drying are removed.

Next, in a step S110, second baking is performed on the molded body, so that a sintered body is formed. The second baking is performed in an inert atmosphere or an oxidation atmosphere at a temperature higher than or equal to 400° C. and lower than or equal to 1700° C., preferably higher than or equal to 400° C. and lower than or equal to 1400° C. The treatment time of the second baking may be, for example, longer than or equal to 1 hour and shorter than or equal to 72 hours, preferably longer than or equal to 9 hours and shorter than or equal to 72 hours, further preferably longer than or equal to 17 hours and shorter than or equal to 72 hours. In this embodiment, a void in the molded body can be made smaller by the second baking. When the temperature of the second baking is higher than or equal to 400° C. and lower than or equal to 1700° C., preferably higher than or equal to 400° C. and lower than or equal to 1400° C., the relative density of the sintered body is increased, and crystallinity of the In—Ga—Zn oxide in the sintered body can be increased. Further, when the second baking is performed at a lower temperature than that of the first baking, an excessive increase in the crystal grain size of the In—Ga—Zn oxide in the sintered body can be suppressed. However, it is acceptable to perform the second baking at a higher temperature than that of the first baking.

Note that a time needed for temperature rising in the second baking is longer than or equal to 12 hours and shorter than or equal to 240 hours, preferably longer than or equal to 24 hours and shorter than or equal to 240 hours, further preferably longer than or equal to 72 hours and shorter than or equal to 240 hours. Further, a time needed for temperature decreasing in the second baking is longer than or equal to 12 hours and shorter than or equal to 240 hours, preferably longer than or equal to 24 hours and shorter than or equal to 240 hours, further preferably longer than or equal to 72 hours and shorter than or equal to 240 hours. When the time needed for temperature rising and the time needed for temperature decreasing in the second baking are made longer, a crack is less likely to occur in the sintered body, so that a yield of the sputtering target can be improved. In addition, when the time needed for temperature rising and the time needed for temperature decreasing in the second baking are made longer, warpage or distortion of the sintered body is less likely to occur, so that a lowering in crystallinity of the In—Ga—Zn oxide in the sintered body can be suppressed.

The second baking may be performed plural times with different conditions. Specifically, it is preferable that after baking in an inert atmosphere is performed, baking be performed in an oxidation atmosphere. This is because in the case where a void in the molded body is made smaller by the baking in the inert atmosphere, oxygen vacancies are caused in the In—Ga—Zn oxide included in the molded body. Thus, it is preferable to reduce, in the oxidation atmosphere, the oxygen vacancies caused in the In—Ga—Zn oxide included in the molded body. By making the void smaller, the relative density of the sintered body can be increased. Further, by reducing the oxygen vacancies, crystallinity of the In—Ga—Zn oxide in the sintered body can be increased.

Next, in a step S111, finishing treatment is performed on the sintered body, so that a sputtering target is obtained. Specifically, the sintered body is divided or grounded so as to adjust the length, the width, and the thickness. Further, since abnormal discharge might occur when a surface of the sintered body has minute unevenness, polishing treatment is performed on the surface. The polishing treatment is preferably performed by chemical mechanical polishing (CMP).

Through the above steps, a sputtering target including a polycrystalline oxide having high orientation can be formed. Further, the sputtering target has high relative density. Specifically, the relative density of the sputtering target can be set to be higher than or equal to 90%, higher than or equal to 95%, or higher than or equal to 99%. In addition, the sputtering target has high purity. Specifically, the proportion of main components of the sputtering target can be higher than or equal to 99.9 wt. % (3N), preferably higher than or equal to 99.99 wt. % (4N), further preferably higher than or equal to 99.999 wt. % (5N).

As the specific concentration of impurities in the sputtering target, each of alkali metals can be lower than 10 ppm by weight, preferably lower than 5 ppm by weight, further preferably lower than 2 ppm by weight. Each of alkaline earth metals can be lower than 5 ppm by weight, preferably lower than 2 ppm by weight, further preferably lower than 1 ppm by weight. Halogen can be lower than 10 ppm by weight, preferably lower than 5 ppm by weight, further preferably lower than 2 ppm by weight. Boron, magnesium, phosphorus, copper, and germanium can be each lower than 5 ppm by weight, preferably lower than 2 ppm by weight, further preferably lower than 1 ppm by weight. Nitrogen can be lower than 20 ppm by weight, preferably lower than 10 ppm by weight, further preferably lower than 5 ppm by weight, still further preferably lower than 2 ppm by weight. Silicon can be lower than 50 ppm by weight, preferably lower than 20 ppm by weight, further preferably lower than 10 ppm by weight, still further preferably lower than 5 ppm by weight.

With use of the sputtering target including a polycrystalline oxide with high orientation, which is described in this embodiment, an oxide film with high crystallinity can be formed. Further, with use of the oxide film, a transistor with excellent electric characteristics and high reliability can be manufactured.

This embodiment can be combined with the other embodiment as appropriate.

(Embodiment 2)

In this embodiment, a sputtering target which is partly different from that in Embodiment 1 will be described.

FIG. 2 shows a method for forming a sputtering target. Note that between the method for forming a sputtering target shown in FIG. 2 and that shown in FIG. 1, there is a difference only in pressure treatment which is performed before the second baking. Thus, for steps up to and including the step S109 of drying treatment and a removal of the organic substance in FIG. 2, description in Embodiment 1 is referred to.

In a step S120, the dried molded body from which the organic substance has been removed is subjected to pressure treatment. In the pressure treatment, the molded body is preferably pressed, and for example, a weight is preferably used. Alternatively, the molded body may be pressed under high pressure using compressed air.

The pressure treatment performed on the molded body enables a crystal portion in the In—Ga—Zn oxide included in the molded body to have high orientation. Further, a void in the molded body can be made smaller.

Next, in a step S121, second baking is performed on the molded body which has been subjected to pressure treatment, so that a sintered body is formed. For the second baking, description of the second baking in Embodiment 1 is referred to.

Next, in a step S122, finishing treatment is performed on the sintered body, so that a sputtering target is obtained. For the finishing treatment, description of the finishing treatment in Embodiment 1 is referred to.

Through the above steps, a sputtering target including a polycrystalline oxide having high orientation can be formed. Further, the sputtering target has high relative density. Specifically, the relative density of the sputtering target can be set to be higher than or equal to 90%, higher than or equal to 95%, or higher than or equal to 99%. In addition, the sputtering target has high purity. Specifically, the proportion of main components of the sputtering target can be higher than or equal to 99.9 wt. % (3N), preferably higher than or equal to 99.99 wt. % (4N), further preferably higher than or equal to 99.999 wt. % (5N).

As the specific concentration of impurities in the sputtering target, each of alkali metals can be lower than 10 ppm by weight, preferably lower than 5 ppm by weight, further preferably lower than 2 ppm by weight. Each of alkaline earth metals can be lower than 5 ppm by weight, preferably lower than 2 ppm by weight, further preferably lower than 1 ppm by weight. Halogen can be lower than 10 ppm by weight, preferably lower than 5 ppm by weight, further preferably lower than 2 ppm by weight. Boron, magnesium, phosphorus, copper, and germanium can be each lower than 5 ppm by weight, preferably lower than 2 ppm by weight, further preferably lower than 1 ppm by weight. Nitrogen can be lower than 20 ppm by weight, preferably lower than 10 ppm by weight, further preferably lower than 5 ppm by weight, still further preferably lower than 2 ppm by weight. Silicon can be lower than 50 ppm by weight, preferably lower than 20 ppm by weight, further preferably lower than 10 ppm by weight, still further preferably lower than 5 ppm by weight.

With use of the sputtering target including a polycrystalline oxide with high orientation, which is described in this embodiment, an oxide film with high crystallinity can be formed. Further, with use of the oxide film, a transistor with excellent electric characteristics and high reliability can be manufactured.

This embodiment can be combined with the other embodiment as appropriate.

(Embodiment 3)

In this embodiment, a sputtering target which is partly different from those in Embodiment 1 and Embodiment 2 will be described.

FIG. 3 shows a method for forming a sputtering target. Note that in the method for forming a sputtering target shown in FIG. 3, second baking is performed together with pressure treatment, which is the only difference from the method shown in FIG. 1. Thus, for steps up to and including the step S109 of drying treatment and a removal of the organic substance in FIG. 3, description in Embodiment 1 is referred to.

In a step S130, the dried molded body from which the organic substance has been removed is subjected to pressure treatment and second baking treatment together. For the pressure treatment, description of the pressure treatment in Embodiment 2 is referred to. Further, for the second baking treatment, description of the second baking in Embodiment 1 is referred to. Specifically, the molded body may be baked as well as being pressed using a weight or compressed air. Alternatively, it is acceptable to use a jig heated at a high temperature to press the molded body.

The pressure treatment and the second baking performed together on the molded body enable a crystal portion in the In—Ga—Zn oxide included in the molded body to have high orientation. Further, a void in the molded body can be made smaller, and accordingly the relative density can be increased.

Next, in a step S131, finishing treatment is performed on the sintered body, so that a sputtering target is obtained. For the finishing treatment, description of the finishing treatment in Embodiment 1 is referred to.

Through the above steps, a sputtering target including a polycrystalline oxide having high orientation can be formed. Further, the sputtering target has high relative density. Specifically, the relative density of the sputtering target can be set to be higher than or equal to 90%, higher than or equal to 95%, or higher than or equal to 99%. In addition, the sputtering target has high purity. Specifically, the proportion of main components of the sputtering target can be higher than or equal to 99.9 wt. % (3N), preferably higher than or equal to 99.99 wt. % (4N), further preferably higher than or equal to 99.999 wt. % (5N).

As the specific concentration of impurities in the sputtering target, each of alkali metals can be lower than 10 ppm by weight, preferably lower than 5 ppm by weight, further preferably lower than 2 ppm by weight. Each of alkaline earth metals can be lower than 5 ppm by weight, preferably lower than 2 ppm by weight, further preferably lower than 1 ppm by weight. Halogen can be lower than 10 ppm by weight, preferably lower than 5 ppm by weight, further preferably lower than 2 ppm by weight. Boron, magnesium, phosphorus, copper, and germanium can be each lower than 5 ppm by weight, preferably lower than 2 ppm by weight, further preferably lower than 1 ppm by weight. Nitrogen can be lower than 20 ppm by weight, preferably lower than 10 ppm by weight, further preferably lower than 5 ppm by weight, still further preferably lower than 2 ppm by weight. Silicon can be lower than 50 ppm by weight, preferably lower than 20 ppm by weight, further preferably lower than 10 ppm by weight, still further preferably lower than 5 ppm by weight.

With use of the sputtering target including a polycrystalline oxide with high orientation, which is described in this embodiment, an oxide film with high crystallinity can be formed. Further, with use of the oxide film, a transistor with excellent electric characteristics and high reliability can be manufactured.

This embodiment can be combined with the other embodiment as appropriate.

(Embodiment 4)

In this embodiment, a method for using the sputtering target described in the above embodiment will be described.

FIG. 4A is a schematic diagram illustrating a situation where an ion 1001 collides with a sputtering target 1000, and a sputtered particle 1002 with crystallinity is separated. FIG. 4B shows a separated sputtered particle 1002. A crystal grain has a cleavage plane parallel to a surface of the sputtering target 1000. In addition, the crystal grain has a portion where an interatomic bond is weak. When the ion 1001 collides with the crystal grain, an interatomic bond of the portion where an interatomic bond is weak is cut. Accordingly, the sputtered particle 1002 is separated in a flat-plate form by being cut out along the cleavage plane and the portion where an interatomic bond is weak. Note that the equivalent circle diameter of a flat plane of the sputtered particle 1002 is greater than or equal to 1/3000 and less than or equal to 1/20, preferably greater than or equal to 1/1000 and less than or equal to 1/30 of an average grain size of the crystal grains.

Here, the term "equivalent circle diameter of a plane" refers to the diameter of a perfect circle having the same area as the plane.

Alternatively, when part of the crystal grain is separated as a particle from a cleavage plane and exposed to plasma, cutting of a bond starts at the portion where an interatomic bond is weak, so that a plurality of sputtered particles 1002 are generated.

With use of an oxygen cation as the ion 1001, plasma damage at the film formation can be alleviated. Thus, when the ion 1001 collides with the surface of the sputtering target 1000, a lowering in crystallinity of the sputtering target 1000 can be suppressed or a change of the sputtering target 1000 into an amorphous state can be suppressed.

It is preferable that the separated sputtered particles 1002 be positively charged. There is no particular limitation on a timing of when the sputtered particle 1002 is positively charged, but it is preferably positively charged by receiving an electric charge when the ion 1001 collides. Alternatively, in the case where plasma is generated, the sputtered particle 1002 is preferably exposed to plasma to be positively charged. Further alternatively, the ion 1001 which is an oxygen cation is preferably bonded to a side surface, a top surface, or a bottom surface of the sputtered particle 1002, whereby the sputtered particle 1002 is positively charged.

A state in which sputtered particles are deposited on a deposition surface (a surface where sputtered particles are deposited) is described below with reference to FIGS. 5A and 5B. Note that in FIGS. 5A and 5B, sputtered particles which have been already deposited are shown by dotted lines.

Figure 5A:
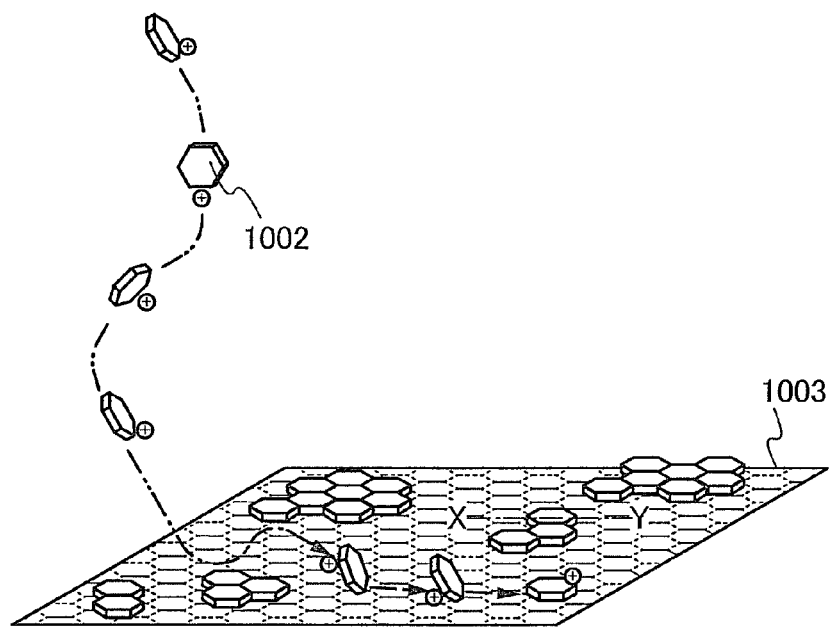
FIGS. 5A and 5B are schematic diagrams illustrating a situation where a sputtered particle reaches a deposition surface and is deposited.

In FIG. 5A, a deposition surface 1003 is a surface where several layers of oxide films are deposited. As illustrated in FIG. 5A, in the case where the sputtered particles 1002 are positively charged, the sputtered particles 1002 are deposited in a region of the deposition surface 1003, where no sputtered particle 1002 has been deposited yet. This is because the sputtered particles 1002 which are positively charged repel with each other.

Figure 5B:
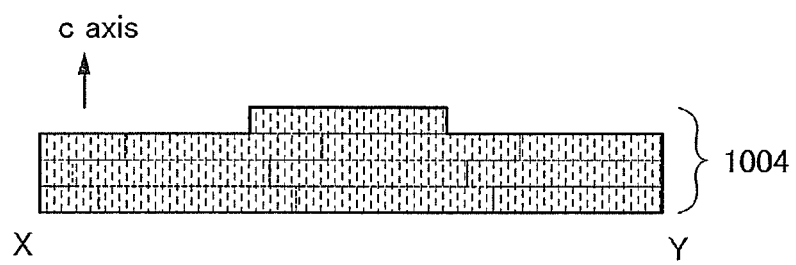

FIG. 5B is a cross-sectional view taken along dashed-dotted line X-Y in FIG. 5A. An oxide film 1004 obtained by depositions of the sputtered particles 1002 in the above manner has crystals whose c-axes are aligned in a direction perpendicular to the deposition surface 1003. That is, the oxide film 1004 is a c-axis aligned crystalline oxide semiconductor (CAAC-OS) film.

In this specification, the trigonal and rhombohedral crystal systems are included in the hexagonal crystal system.

The CAAC-OS film is one of oxide semiconductor films including a plurality of crystal parts, and most of the crystal part each fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around 56°. This peak is derived from the (110) plane of the $InGaZnO_4$ crystal. Here, analysis ($\varphi$ scan) is performed under conditions where the sample is rotated around a normal vector of a sample surface as an axis ($\varphi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\varphi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

An oxide film which is obtained by deposition has a uniform thickness and a uniform crystal orientation. The sputtered particles are not deposited randomly. The sputtered particles which are positively charged interact with each other and are deposited orderly so that c-axes are aligned in a direction perpendicular to the deposition surface.

With use of a sputtering target in the way as described above, an oxide film having a uniform thickness and a uniform crystal orientation can be formed.

The oxide film described in this embodiment can be used for a transparent conductive film or a channel region of a transistor. With use of the oxide film described in this embodiment for a channel region of a transistor, the transistor can have excellent electric characteristics and high reliability.

This embodiment can be combined with the other embodiment as appropriate.

(Embodiment 5)

In this embodiment, a film formation apparatus for forming the oxide film with high crystallinity described in the above embodiment is described.

First, a structure of a film formation apparatus which allows the entry of few impurities into a film during film formation is described with reference to FIG. 7 and FIGS. 8A to 8C.

Figure 7:
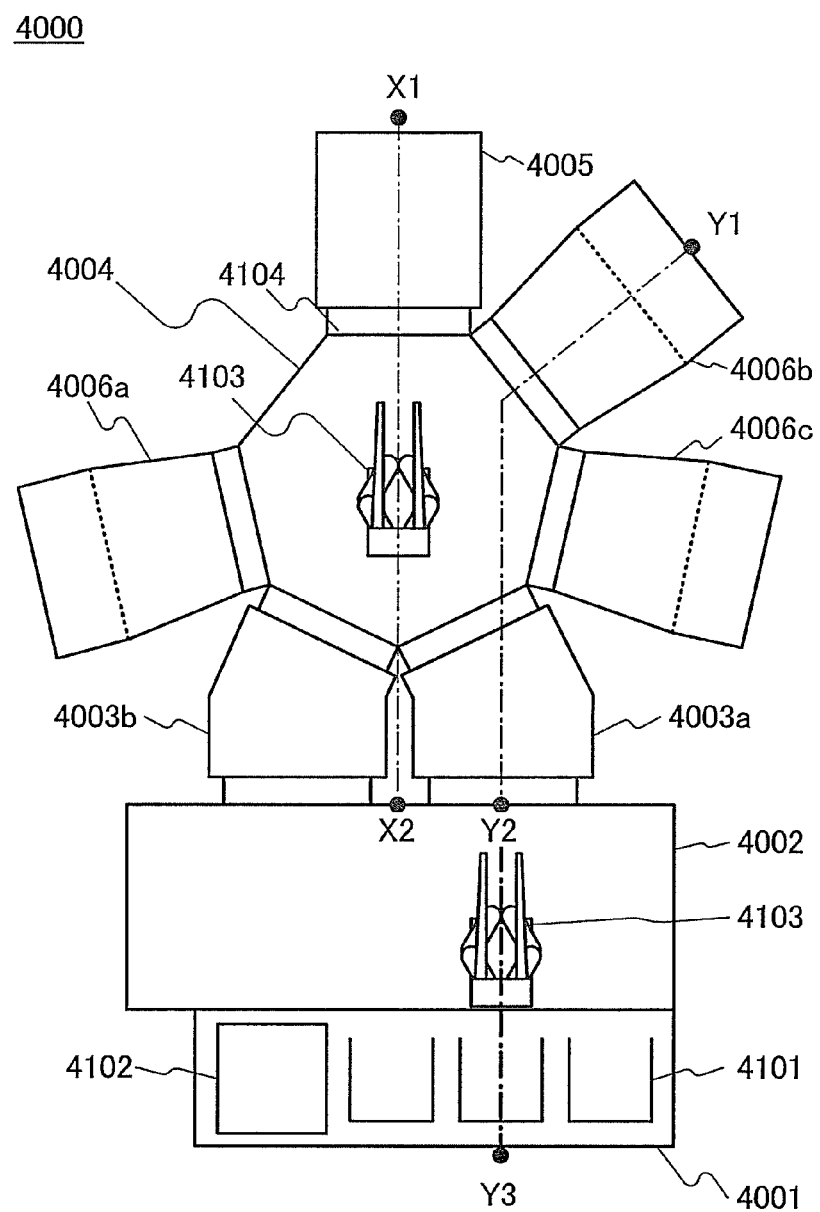
FIG. 7 is a top view illustrating an example of a film formation apparatus.

FIG. 7 is a top view schematically illustrating a single wafer multi-chamber film formation apparatus 4000. The film formation apparatus 4000 includes an atmosphere-side substrate supply chamber 4001 including a cassette port 4101 for holding a substrate and an alignment port 4102 for performing alignment of a substrate, an atmosphere-side substrate transfer chamber 4002 through which a substrate is transferred from the atmosphere-side substrate supply chamber 4001, a load lock chamber 4003a where a substrate is carried and the pressure is switched from atmospheric pressure to reduced pressure or from reduced pressure to atmospheric pressure, an unload lock chamber 4003b where a substrate is carried out and the pressure is switched from reduced pressure to atmospheric pressure or from atmospheric pressure to reduced pressure, a transfer chamber 4004 through which a substrate is transferred in a vacuum, a substrate heating chamber 4005 where a substrate is heated, and film formation chambers 4006a, 4006b, and 4006c in each of which a target is placed for film formation.

Note that a plurality of the cassette ports 4101 may be provided as illustrated in FIG. 7 (in FIG. 7, three cassette ports 4101 are provided).

The atmosphere-side substrate transfer chamber 4002 is connected to the load lock chamber 4003a and the unload lock chamber 4003b, the load lock chamber 4003a and the unload lock chamber 4003b are connected to the transfer chamber 4004, and the transfer chamber 4004 is connected to the substrate heating chamber 4005 and the film formation chambers 4006a, 4006b, and 4006c.

Gate valves 4104 are provided for connecting portions between chambers so that each chamber except the atmosphere-side substrate supply chamber 4001 and the atmosphere-side substrate transfer chamber 4002 can be independently kept under vacuum. Moreover, the atmosphere-side substrate transfer chamber 4002 and the transfer chamber 4004 each include a transfer robot 4103, with which a glass substrate can be transferred.

Further, it is preferable that the substrate heating chamber 4005 also serve as a plasma treatment chamber. The film formation apparatus 4000 enables a substrate to transfer without being exposed to the air between treatment and treatment; therefore, adsorption of impurities on the substrate can be suppressed. In addition, the order of film formation, heat treatment, or the like can be freely determined. Note that the number of the transfer chambers, the number of the film formation chambers, the number of the load lock chambers, the number of the unload lock chambers, and the number of the substrate heating chambers are not limited to the above, and the numbers thereof can be set as appropriate depending on the space for placement or the process conditions.

Figure 8A:
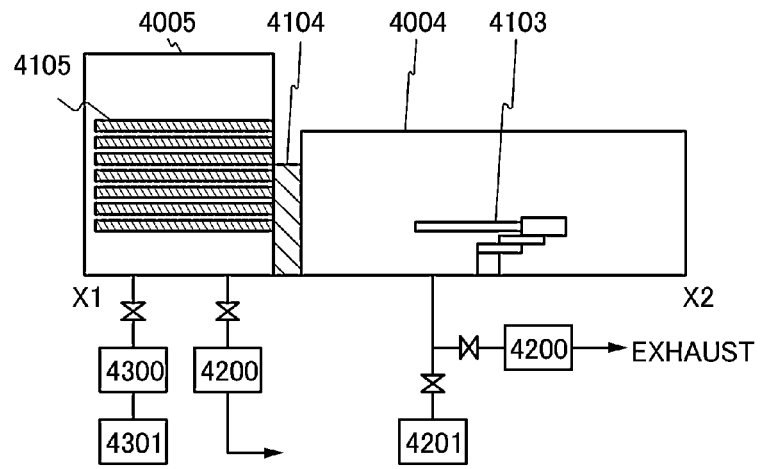
FIGS. 8A to 8C illustrate an example of a film formation apparatus.
Figure 8B:
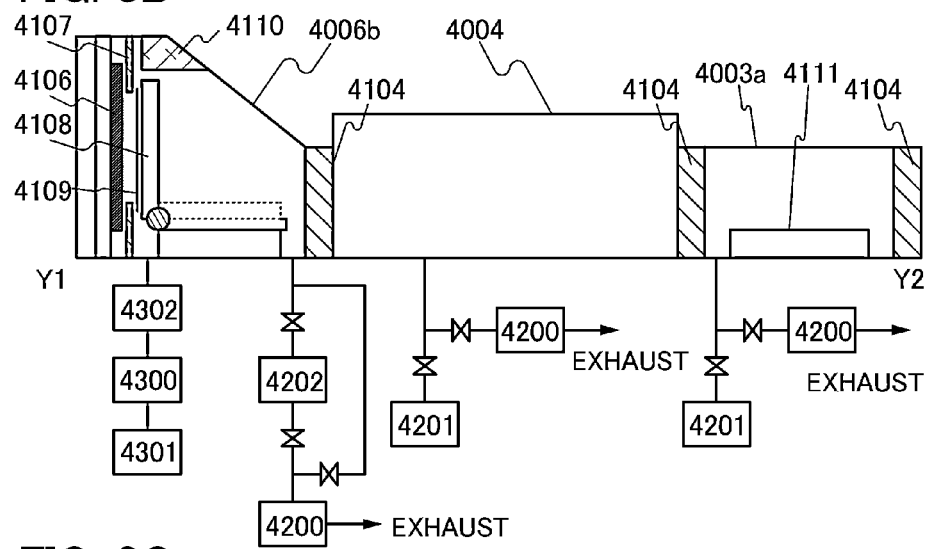
Figure 8C:
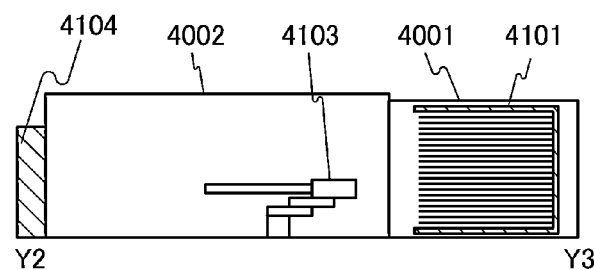

Next, FIG. 8A, FIG. 8B, and FIG. 8C are a cross-sectional view taken along dashed-dotted line X1-X2, a cross-sectional view taken along dashed-dotted line Y1-Y2, and a cross-sectional view taken along dashed-dotted line Y2-Y3, respectively, in the film formation apparatus 4000 illustrated in FIG. 7.

FIG. 8A is a cross section of the substrate heating chamber 4005 and the transfer chamber 4004, and the substrate heating chamber 4005 includes a plurality of heating stages 4105 which can hold a substrate. Note that although the substrate heating chamber 4005 including the seven heating stages 4105 is illustrated in FIG. 8A, one embodiment of the present invention is not limited to such a structure. The number of heating stages 4105 may be greater than or equal to one and less than seven. Alternatively, the number of heating stages 4105 may be greater than or equal to eight. It is preferable to increase the number of the heating stages 4105 because a plurality of substrates can be subjected to heat treatment at the same time, which leads to an increase in productivity. Further, the substrate heating chamber 4005 is connected to a vacuum pump 4200 through a valve. As the vacuum pump 4200, a dry pump or a mechanical booster pump can be used, for example.

As a heating mechanism which can be used for the substrate heating chamber 4005, a heating mechanism in which heating is performed by using a resistance heater or the like may be used, for example. Alternatively, a heating mechanism in which heating is performed by heat conduction or heat radiation from a medium such as a heated gas may be used. For example, RTA (rapid thermal anneal) treatment, such as GRTA (gas rapid thermal anneal) treatment or LRTA (lamp rapid thermal anneal) treatment, can be used. The LRTA treatment is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as a gas.

Moreover, the substrate heating chamber 4005 is connected to a refiner 4301 through a mass flow controller 4300. Note that although the refiner 4301 and the mass flow controller 4300 can be provided for each of a plurality of kinds of gases, only one refiner 4301 and one mass flow controller 4300 are described for easy understanding. As the gas introduced to the substrate heating chamber 4005, a gas whose dew point is −80° C. or lower, preferably −100° C. or lower can be used; for example, an oxygen gas, a nitrogen gas, and a rare gas (e.g., an argon gas) are used.

The transfer chamber 4004 includes the transfer robot 4103. The transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, evacuation can be performed using the vacuum pump 4200 when the pressure inside the transfer chamber 4004 is in the range of atmospheric pressure to low vacuum (approximately 0.1 Pa to several hundred Pa) and then, by switching the valves, evacuation can be performed using the cryopump 4201 when the pressure inside the transfer chamber 4004 is in the range of middle vacuum to ultra-high vacuum (0.1 Pa to $1 \times 10^{-7}$ Pa).

Alternatively, two or more cryopumps 4201 may be connected in parallel to the transfer chamber 4004. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 8B shows a cross section of the film formation chamber 4006b, the transfer chamber 4004, and the load lock chamber 4003a.

Here, the details of the film formation chamber (sputtering chamber) are described with reference to FIG. 8B. The film formation chamber 4006b illustrated in FIG. 8B includes a target 4106, an attachment protection plate 4107, and a substrate stage 4108. Note that here, a substrate 4109 is provided on the substrate stage 4108. Although not illustrated, the substrate stage 4108 may include a substrate holding mechanism which holds the substrate 4109, a rear heater which heats the substrate 4109 from the back surface, or the like.

Note that the substrate stage 4108 is held substantially perpendicularly to a floor during film formation and is held substantially parallel to the floor when the substrate is delivered. In FIG. 8B, the position where the substrate stage 4108 is held when the substrate is delivered is denoted by a dashed line. With such a structure, the probability that dust or a particle which might be mixed into a film being formed is attached to the substrate 4109 can be suppressed as compared to the case where the substrate stage 4108 is held parallel to the floor. However, there is a possibility that the substrate 4109 falls when the substrate stage 4108 is held vertically (90°) to the floor; therefore, the angle of the substrate stage 4108 to the floor is preferably wider than or equal to 80° and narrower than 90°.

The attachment protection plate 4107 can suppress deposition of a particle which is sputtered from the target 4106 on a region where deposition is not needed. Moreover, the attachment protection plate 4107 is preferably processed to prevent accumulated sputtered particles from being separated. For example, blasting treatment which increases surface roughness may be performed, or roughness may be formed on the surface of the attachment protection plate 4107.

The film formation chamber 4006b is connected to a mass flow controller 4300 through a gas heating system 4302, and the gas heating system 4302 is connected to a refiner 4301 through the mass flow controller 4300. With the gas heating system 4302, a gas to be introduced to the film formation chamber 4006b can be heated to a temperature higher than or equal to 40° C. and lower than or equal to 400° C., preferably higher than or equal to 50° C. and lower than or equal to 200° C. Note that although the gas heating system 4302, the mass flow controller 4300, and the refiner 4301 can be provided for each of a plurality of kinds of gases, only one gas heating system 4302, one mass flow controller 4300, and one refiner 4301 are provided for easy understanding. As the gas introduced to the film formation chamber 4006b, a gas whose dew point is −80° C. or lower, preferably −100° C. or lower can be used; for example, an oxygen gas, a nitrogen gas, and a rare gas (e.g., an argon gas) are used.

In the film formation chamber 4006b, a facing-target-type sputtering device may be employed. In each of the above-described structures of the facing-target-type sputtering device, plasma is confined between the targets; therefore, plasma damage to a substrate can be reduced. Further, step coverage can be improved because an incident angle of a sputtered particle to the substrate can be made smaller depending on the inclination of the target.

Note that a parallel-plate-type sputtering device or an ion beam sputtering device may be provided in the film formation chamber 4006b.

In the case where the refiner is provided just before the gas is introduced, the length of a pipe between the refiner and the film formation chamber 4006b is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly. As the pipe of the gas, a metal pipe the inside of which is covered with an iron fluoride, an aluminum oxide, a chromium oxide, or the like may be used. With the above pipe, the amount of released gas containing impurities is made small and the entry of impurities into the gas can be reduced as compared with a SUS316L-EP pipe, for example. Further, a high-performance ultra-compact metal gasket joint (a UPG joint) is preferably used as a joint of the pipe. A structure where all the materials of the pipe are metals is preferable because the effect of the generated released gas or the external leakage can be reduced compared with a structure where resin or the like is used.

The film formation chamber 4006b is connected to a turbo molecular pump 4202 and a vacuum pump 4200 through valves.

In addition, the film formation chamber 4006b is provided with a cryotrap 4110.

The cryotrap 4110 is a mechanism which can adsorb a molecule (or an atom) having a relatively high melting point, such as water. The turbo molecular pump 4202 is capable of stably evacuating a large-sized molecule (or atom), needs low frequency of maintenance, and thus enables high productivity, whereas it has a low capability in evacuating hydrogen and water. Hence, the cryotrap 4110 is connected to the film formation chamber 4006b so as to have a high capability in evacuating water or the like. The temperature of a refrigerator of the cryotrap 4110 is set to be lower than or equal to 100 K, preferably lower than or equal to 80 K. In the case where the cryotrap 4110 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively.

Note that the evacuation method of the film formation chamber 4006b is not limited to the above, and a structure similar to that in the evacuation method described in the transfer chamber 4004 (the evacuation method using the cryopump and the vacuum pump) may be employed. Needless to say, the evacuation method of the transfer chamber 4004 may have a structure similar to that of the film formation chamber 4006b (the evacuation method using the turbo molecular pump and the vacuum pump).

Note that in each of the above transfer chamber 4004, the substrate heating chamber 4005, and the film formation chamber 4006b, the back pressure (total pressure) and the partial pressure of each gas molecule (atom) are preferably set as follows. In particular, the back pressure and the partial pressure of each gas molecule (atom) in the film formation chamber 4006b need to be noted because impurities might enter a film to be formed.

In each of the above chambers, the back pressure (total pressure) is lower than or equal to $1 \times 10^{-4}$ Pa, preferably lower than or equal to $3 \times 10^{-5}$ Pa, further preferably lower than or equal to $1 \times 10^{-5}$ Pa. In each of the above chambers, the partial pressure of a gas molecule (atom) having a mass-to-charge ratio (m/z) of 18 is lower than or equal to $3 \times 10^{-5}$ Pa, preferably lower than or equal to $1 \times 10^{-5}$ Pa, further preferably lower than or equal to $3 \times 10^{-6}$ Pa. Further, in each of the above chambers, the partial pressure of a gas molecule (atom) having a mass-to-charge ratio (m/z) of 28 is lower than or equal to $3 \times 10^{-5}$ Pa, preferably lower than or equal to $1 \times 10^{-5}$ Pa, further preferably lower than or equal to $3 \times 10^{-6}$ Pa. Moreover, in each of the above chambers, the partial pressure of a gas molecule (atom) having a mass-to-charge ratio (m/z) of 44 is lower than or equal to $3 \times 10^{-5}$ Pa, preferably lower than or equal to $1 \times 10^{-5}$ Pa, further preferably lower than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the above transfer chamber 4004, the substrate heating chamber 4005, and the film formation chamber 4006b preferably have a small amount of external leakage or internal leakage.

For example, in each of the above transfer chamber 4004, the substrate heating chamber 4005, and the film formation chamber 4006b, the leakage rate is less than or equal to $3 \times 10^{-6}$ Pa·m$^3$/s, preferably less than or equal to $1 \times 10^{-6}$ Pa·m$^3$/s. The leakage rate of a gas molecule (atom) having a mass-to-charge ratio (m/z) of 18 is less than or equal to $1 \times 10^{-7}$ Pa·m$^3$/s, preferably less than or equal to $3 \times 10^{-8}$ Pa·m$^3$/s. The leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. The leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

For example, an open/close portion of the film formation chamber 4006b can be sealed with a metal gasket. For the metal gasket, metal covered with an iron fluoride, an aluminum oxide, or a chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the film formation apparatus 4000, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above member of the film formation apparatus 4000 may be covered with an iron fluoride, an aluminum oxide, a chromium oxide, or the like.

The member of the film formation apparatus 4000 is preferably formed with only metal as much as possible. For example, in the case where a viewing window formed with quartz or the like is provided, it is preferable that the surface of the member be thinly covered with an iron fluoride, an aluminum oxide, a chromium oxide, or the like so as to suppress the released gas.

When an adsorbate is present in the film formation chamber, the adsorbate does not affect the pressure in the film formation chamber because it is adsorbed onto an inner wall or the like; however, the adsorbate causes a release of gas when the inside of the film formation chamber is evacuated. Therefore, although there is no correlation between the leakage rate and the evacuation rate, it is important that the adsorbate present in the film formation chamber be desorbed as much as possible and evacuation be performed in advance with use of a pump with high evacuation capability. Note that the film formation chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced to the film formation chamber, the desorption rate of water or the like, which is difficult to desorb simply by evacuation, can be further increased. Note that the rate of desorption of the adsorbate can be further increased by heating of the inert gas to be introduced at substantially the same temperature as the temperature of the baking. Here, a rare gas is preferably used as an inert gas. Depending on the kind of a film to be formed, oxygen or the like may be used instead of an inert gas. For example, in the case of depositing an oxide, using oxygen which is the main component of the oxide is preferable in some cases.

Alternatively, treatment for evacuating the inside of the film formation chamber is preferably performed a certain period of time after a heated oxygen gas, a heated inert gas such as a heated rare gas, or the like is introduced to increase pressure in the film formation chamber. The introduction of the heated gas can desorb the adsorbate in the film formation chamber, and the impurities present in the film formation chamber can be reduced. Note that a positive effect can be achieved when this treatment is repeated 2 to 30 times inclusive, preferably 5 to 15 times inclusive. Specifically, an inert gas, oxygen, or the like at a temperature in the range of 40° C. to 400° C., preferably 50° C. to 200° C. is supplied to the film formation chamber, so that the pressure therein can be kept in the range of 0.1 Pa to 10 kPa, preferably 1 Pa to 1 kPa, further preferably 5 Pa to 100 Pa for longer than or equal to 1 minute and shorter than or equal to 300 minutes, preferably longer than or equal to 5 minutes and shorter than or equal to 120 minutes. After that, the inside of the film formation chamber is evacuated for longer than or equal to 5 minutes and shorter than or equal to 300 minutes, preferably longer than or equal to 10 minutes and shorter than or equal to 120 minutes.

The rate of desorption of the adsorbate can be further increased also by dummy film formation. Here, the dummy film formation refers to film formation on a dummy substrate by sputtering or the like, in which a film is formed on the dummy substrate and the inner wall of the film formation chamber so that impurities in the film formation chamber and an adsorbate on the inner wall of the film formation chamber are confined in the film. For a dummy substrate, a substrate which releases a smaller amount of gas is preferably used. By performing dummy film formation, impurity concentration in a film to be formed can be reduced. Note that the dummy film formation may be performed at the same time as the baking of the film formation chamber.

Next, the details of the transfer chamber 4004 and the load lock chamber 4003a illustrated in FIG. 8B and the atmosphere-side substrate transfer chamber 4002 and the atmosphere-side substrate supply chamber 4001 illustrated in FIG. 8C are described. Note that FIG. 8C is a cross section of the atmosphere-side substrate transfer chamber 4002 and the atmosphere-side substrate supply chamber 4001.

For the transfer chamber 4004 illustrated in FIG. 8B, the description of the transfer chamber 4004 illustrated in FIG. 8A can be referred to.

The load lock chamber 4003a includes a substrate delivery stage 4111. When a pressure in the load lock chamber 4003a becomes an atmospheric pressure by being increased from a reduced pressure, the substrate delivery stage 4111 receives a substrate from the transfer robot 4103 provided in the atmosphere-side substrate transfer chamber 4002. After that, the load lock chamber 4003a is evacuated into vacuum so that the pressure therein becomes a reduced pressure and then the transfer robot 4103 provided in the transfer chamber 4004 receives the substrate from the substrate delivery stage 4111.

Further, the load lock chamber 4003a is connected to a vacuum pump 4200 and a cryopump 4201 through valves. For a method for connecting evacuation systems such as the vacuum pump 4200 and the cryopump 4201, the description of the method for connecting the transfer chamber 4004 can be referred to, and the description thereof is omitted here. Note that the unload lock chamber 4003b illustrated in FIG. 7 can have a structure similar to that in the load lock chamber 4003a.

The atmosphere-side substrate transfer chamber 4002 includes the transfer robot 4103. The transfer robot 4103 can deliver a substrate from the cassette port 4101 to the load lock chamber 4003a or deliver a substrate from the load lock chamber 4003a to the cassette port 4101. Further, a mechanism for suppressing entry of dust or a particle, such as high efficiency particulate air (HEPA) filter, may be provided above the atmosphere-side substrate transfer chamber 4002 and the atmosphere-side substrate supply chamber 4001.

The atmosphere-side substrate supply chamber 4001 includes a plurality of the cassette ports 4101. The cassette port 4101 can hold a plurality of substrates.

When an oxide film is formed with use of the above film formation apparatus, the entry of impurities into the oxide film can be suppressed. Further, when a film in contact with the oxide film is formed with use of the above film formation apparatus, the entry of impurities into the oxide film from the film in contact therewith can be suppressed.

Next, a method for forming a CAAC-OS film with use of the above film formation apparatus is described.

In order to form the oxide film, the sputtering target described in the above embodiment is used.

The surface temperature of the sputtering target is set to be lower than or equal to 100° C., preferably lower than or equal to 50° C., further preferably about room temperature (typically, 25° C.). In a sputtering apparatus for a large substrate, a sputtering target having a large area is often used. However, it is difficult to form a sputtering target for a large substrate without a juncture. In fact, a plurality of sputtering targets are arranged so that there is as little space as possible therebetween to obtain a large shape; however, a slight space is inevitably generated. When the surface temperature of the sputtering target increases, in some cases, Zn or the like is volatilized from such slight spaces, and the spaces might expand gradually. When the space expands, a metal of a backing plate or a metal used for adhesion might be sputtered and cause an increase in the impurity concentration. Thus, it is preferable that the sputtering target be cooled sufficiently.

Specifically, for the backing plate, a metal having high conductivity and a high heat dissipation property (specifically Cu) is used. The sputtering target can be cooled efficiently by making a sufficient amount of cooling water flow through a water channel which is formed in the backing plate.

The oxide film is formed in an oxygen gas atmosphere with a substrate heating temperature higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide film is greater than or equal to 1 nm and less than or equal to 40 nm, preferably greater than or equal to 3 nm and less than or equal to 20 nm. As the substrate heating temperature during the film formation is higher, the impurity concentration in the obtained oxide film is lower. Further, migration of sputtered particles on a deposition surface is likely to occur; therefore, the atomic arrangement in the oxide film is ordered and the density thereof is increased, so that a CAAC-OS film with a high degree of crystallinity is formed easily. Furthermore, when the film formation is performed in an oxygen gas atmosphere, plasma damage is alleviated and a surplus atom such as a rare gas atom is not contained in the oxide film, whereby a CAAC-OS film with a high degree of crystallinity is formed easily. Note that the film formation may be performed in a mixed atmosphere including an oxygen gas and a rare gas. In that case, the percentage of an oxygen gas is set to be higher than or equal to 30 vol. %, preferably higher than or equal to 50 vol. %, further preferably higher than or equal to 80 vol. %.

Note that in the case where the sputtering target includes Zn, plasma damage is alleviated by the film formation in an oxygen gas atmosphere; thus, an oxide film in which Zn is unlikely to be volatilized can be obtained.

The oxide film is formed under conditions in which the film formation pressure is lower than or equal to 0.8 Pa, preferably lower than or equal to 0.4 Pa, and the distance between the sputtering target and a substrate is less than or equal to 100 mm, preferably less than or equal to 40 mm, further preferably less than or equal to 25 mm. When the oxide film is formed under such a condition, the frequency of the collision between a sputtered particle and another sputtered particle, a gas molecule, or an ion can be reduced. That is, depending on the film formation pressure, the distance between the sputtering target and the substrate is made shorter than the mean free path of a sputtered particle, a gas molecule, or an ion, so that the concentration of impurities entered the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, an ethane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the degree of crystallinity is lowered due to the large diameter of the molecule (atom) when the molecule (atom) enters the film. For this reason, it can be said that, for example, a molecule (atom) whose diameter is larger than that of Ar is likely to behave as an impurity.

Next, heat treatment is performed. The heat treatment is performed under reduced pressure or in an inert atmosphere or an oxidation atmosphere. By the heat treatment, the impurity concentration in the CAAC-OS film can be reduced.

The heat treatment is preferably performed in a manner such that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the impurity concentration in the CAAC-OS film can be reduced; however, oxygen vacancies are caused at the same time. By the heat treatment in an oxidation atmosphere, the caused oxygen vacancies can be reduced.

When heat treatment is performed on the oxide semiconductor film after the film formation in addition to the substrate heating in the film formation, the impurity concentration in the CAAC-OS film can be significantly reduced.

Specifically, the concentration of hydrogen in the CAAC-OS film, which is measured by secondary ion mass spectrometry (SIMS), can be set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

The concentration of carbon in the CAAC-OS film, which is measured by SIMS, can be set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The concentration of carbon in the CAAC-OS film, which is measured by SIMS, can be set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The amount of each of the following gas molecules (atoms) released from the CAAC-OS film can be less than or equal to $1\times10^{19}$/cm$^3$, preferably less than or equal to $1\times10^{18}$/cm$^3$ or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A known measurement method of the amount of released oxygen atoms is referred to for a measurement method of the release amount using TDS analysis.

In the above manner, a CAAC-OS film with a high degree of crystallinity can be formed.

This embodiment can be combined with the other embodiment as appropriate.

This application is based on Japanese Patent Application serial no. 2012-174564 filed with Japan Patent Office on Aug. 7, 2012, the entire contents of which are hereby incorporated by reference.

What is claimed is:

1. A method for forming a sputtering target comprising the steps of:
   mixing raw materials;
   forming a crystalline oxide by performing a first baking of the raw materials;
   forming a crystalline oxide powder by grinding the crystalline oxide;
   uniformizing particle sizes of the crystalline oxide powder by using a first sieve through which a particle with a size less than or equal to 1 µm passes and a second sieve through which a particle with a size less than 0.01 µm passes; and then
   obtaining slurry by mixing the crystalline oxide powder with water and an organic substance;
   pouring the slurry into a mold provided with a filter;
   removing the water and the organic substance from the slurry through the filter, thereby forming a molded body;
   removing residual water and residual organic substance in the molded body by performing a heat treatment;
   pressing the molded body after the heat treatment; and then
   performing a second baking of the molded body,
   wherein a first step of the first baking is performed in an inert atmosphere and a second step of the first baking is performed in an oxidation atmosphere, and
   wherein the second baking is performed at a higher temperature than a temperature of the heat treatment.

2. The method for forming a sputtering target according to claim 1, wherein the first baking is performed at a temperature from 1200° C. to 1700° C. for a period from 1 hour to 72 hours.

3. The method for forming a sputtering target according to claim 1, wherein the second baking is performed at a temperature from 1200° C. to 1400° C. for a period from 1 hour to 72 hours in an inert atmosphere or an oxidation atmosphere.

4. The method for forming a sputtering target according to claim 1, wherein the particle sizes of the crystalline oxide powder is made to be greater than or equal to 0.01 µm and less than or equal to 1 µm.

5. The method for forming a sputtering target according to claim 1, wherein the raw materials are an indium oxide, a gallium oxide, and a zinc oxide.

6. The method for forming a sputtering target according to claim 1, wherein the heat treatment is performed at a temperature from 300° C. to 700° C.

7. A method for forming a sputtering target comprising the steps of:
   mixing raw materials;
   forming a crystalline oxide by performing a first baking of the raw materials;
   forming a crystalline oxide powder by grinding the crystalline oxide;
   uniformizing particle sizes of the crystalline oxide powder by using a first sieve through which a particle with a size less than or equal to 1 µm passes and a second sieve through which a particle with a size less than 0.01 µm passes; and then
   obtaining slurry by mixing the crystalline oxide powder with water and an organic substance;
   pouring the slurry into a mold provided with a filter;
   removing the water and the organic substance from the slurry through the filter, thereby forming a molded body;
   removing residual water and residual organic substance in the molded body, thereby providing voids in the molded body;
   pressing the molded body to reduce the voids in the molded body; and then
   performing a second baking of the molded body,
   wherein a first step of the first baking is performed in an inert atmosphere and a second step of the first baking is performed in an oxidation atmosphere, and
   wherein the second baking is performed at a lower temperature than a temperature of the first baking.

8. The method for forming a sputtering target according to claim 7, wherein the first baking is performed at a temperature from 1200° C. to 1700° C. for a period from 1 hour to 72 hours.

9. The method for forming a sputtering target according to claim 7, wherein the second baking is performed at a temperature from 1200° C. to 1400° C. for a period from 1 hour to 72 hours in an inert atmosphere or an oxidation atmosphere.

10. The method for forming a sputtering target according to claim 7, wherein the particle sizes of the crystalline oxide powder is made to be greater than or equal to 0.01 µm and less than or equal to 1 µm.

11. The method for forming a sputtering target according to claim 7, wherein the raw materials are an indium oxide, a gallium oxide, and a zinc oxide.

12. The method for forming a sputtering target according to claim 7, wherein in the step of pressing, the molded body is pressed using a weight or compressed air.

13. A method for forming a sputtering target comprising the steps of:

mixing raw materials;

forming a crystalline oxide by performing a first baking of the raw materials;

forming a crystalline oxide powder by grinding the crystalline oxide;

uniformizing particle sizes of the crystalline oxide powder by using a first sieve through which a particle with a size less than or equal to 1 µm passes and a second sieve through which a particle with a size less than 0.01 µm passes; and then obtaining slurry by mixing the crystalline oxide powder with water and an organic substance;

pouring the slurry into a mold provided with a filter;

removing the water and the organic substance from the slurry through the filter, thereby forming a molded body;

removing residual water and residual organic substance in the molded body; and pressing the molded body while performing a second baking, wherein a first step of the first baking is performed in an inert atmosphere and a second step of the first baking is performed in an oxidation atmosphere, and wherein the second baking is performed at a lower temperature than a temperature of the first baking.

14. The method for forming a sputtering target according to claim 13, wherein the first baking is performed at a temperature from 1200° C. to 1700° C. for a period from 1 hour to 72 hours.

15. The method for forming a sputtering target according to claim 13, wherein the second baking is performed at a temperature from 1200° C. to 1400° C. for a period from 1 hour to 72 hours in an inert atmosphere or an oxidation atmosphere.

16. The method for forming a sputtering target according to claim 13, wherein the particle sizes of the crystalline oxide powder is made to be greater than or equal to 0.01 µm and less than or equal to 1 µm.

17. The method for forming a sputtering target according to claim 13, wherein the raw materials are an indium oxide, a gallium oxide, and a zinc oxide.

18. The method for forming a sputtering target according to claim 13, wherein in the step of pressing, the molded body is pressed using a weight or compressed air.

* * * * *